(12) United States Patent
Rossini (10) Patent No.: US 8,993,368 B2
(45) Date of Patent: Mar. 31, 2015

(54) METHOD FOR MANUFACTURING AN OPTO-MICROELECTRONIC DEVICE

(75) Inventor: Umberto Rossini, Coublevie (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/111,458

(22) PCT Filed: Apr. 11, 2012

(86) PCT No.: PCT/EP2012/056595
§ 371 (c)(1),
(2), (4) Date: Dec. 18, 2013

(87) PCT Pub. No.: WO2012/140094
PCT Pub. Date: Oct. 18, 2012

(65) Prior Publication Data
US 2014/0113404 A1    Apr. 24, 2014

(30) Foreign Application Priority Data

Apr. 14, 2011 (FR) ..................... 11 53259

(51) Int. Cl.
| H01L 21/00 | (2006.01) |
| H01L 27/146 | (2006.01) |
| G02F 1/1362 | (2006.01) |
| H01L 27/12 | (2006.01) |

(52) U.S. Cl.
CPC .... *H01L 27/14687* (2013.01); *H01L 27/14632* (2013.01); *G02F 1/136277* (2013.01); *H01L 27/1266* (2013.01); *G02F 2001/136281* (2013.01)
USPC .......... 438/73; 257/E21.352; 257/59; 257/72; 257/222; 257/225; 257/440; 438/57; 438/60; 438/458

(58) Field of Classification Search
USPC .............. 257/59, 72, 222, 225, 440, E21.352; 438/57, 60, 73, 458
See application file for complete search history.

(56) References Cited

U.S. PATENT DOCUMENTS

| 2010/0078644 A1 | 4/2010 | Park et al. |
| 2010/0289064 A1 | 11/2010 | Or-Bach et al. |
| 2012/0032294 A1 | 2/2012 | Or-Bach et al. |

OTHER PUBLICATIONS

International Search Report Issued May 29, 2012 in PCT/EP12/056595 Filed Apr. 11, 2012.

*Primary Examiner* — Asok K Sarkar
(74) *Attorney, Agent, or Firm* — Oblon, McClelland, Maier & Neustadt, L.L.P.

(57) ABSTRACT

Method for manufacturing a microelectronic device from a first substrate (10), including the production of at least one electronic component in the semi-conductor substrate after transferring the first substrate (10) onto a second substrate (20), characterized in that it comprises:
 a first phase carried out prior to the transfer, and including forming at least one pattern made of a sacrificial material in a layer of the first substrate (10),
 a second phase carried out after the transfer and including the substitution of the electronic component for the pattern.

24 Claims, 5 Drawing Sheets

Figure 1a

Prior Art

TOP VIEW AFTER TRANSFER

Figure 1b

Prior Art

METHOD FOR MANUFACTURING AN OPTO-MICROELECTRONIC DEVICE

TECHNICAL FIELD OF THE INVENTION

The present invention generally relates to the production of devices such as those containing semiconductors requiring the transfer of functional layers formed on the surface of a substrate onto another medium such as hybrid devices, specially those that combine electronics and optics. The invention more particularly solves the problem of geometric deformations that are induced by the transfer.

The manufacture of any microelectronic device is covered by the invention. Microelectronic device means any type of device made with microelectronics means. Such devices especially include, in addition to devices intended for purely electronic purposes, micro-mechanical or electromechanical devices, such as MEMS (micro-electromechanical systems) or NEMS (nano-electromechanical systems) as well as optical or optoelectronic devices such as MOEMS (micro-optical electromechanical systems).

A particular application of the invention is the production of small imaging devices and especially of less than 1 inch, or 2.54 centimeters. Among others, imaging devices using a transmission technique wherein light rays are generated from a source located on the side opposite the pictures outlet side (or screen).

STATE OF THE ART

The microelectronics industry uses more and more sophisticated techniques in order to produce all sorts of devices that require, at least in part, the implementation of electronic functions. These techniques in particular require a transfer of a functional layer formed on the surface of a first substrate, typically a semiconductor substrate onto a second substrate, in order, for example to increase the integration density by allowing such integration to be obtained not only on the surface but also in volume, by stacking functional layers formed separately. Besides, the transfer of functional layers is often intended to give the devices functional characteristics they would not acquire otherwise, such as, for instance, a better electrical insulation for applications where high voltages are applied or to obtain their transparency as is often required for optoelectronic devices such as imaging devices. Then these are typically small-sized display devices, of less than one inch (25.4 mm), also called micro- or nano-projectors that are produced using the techniques of the microelectronics industry in order to be able to combine efficient transistor-based electronic means, made of single-crystal semiconductor material, with optical components such as, for instance, liquid crystals to be used in all kinds of portable devices such as telephones, computers and other mobile equipment.

Figure 1A:
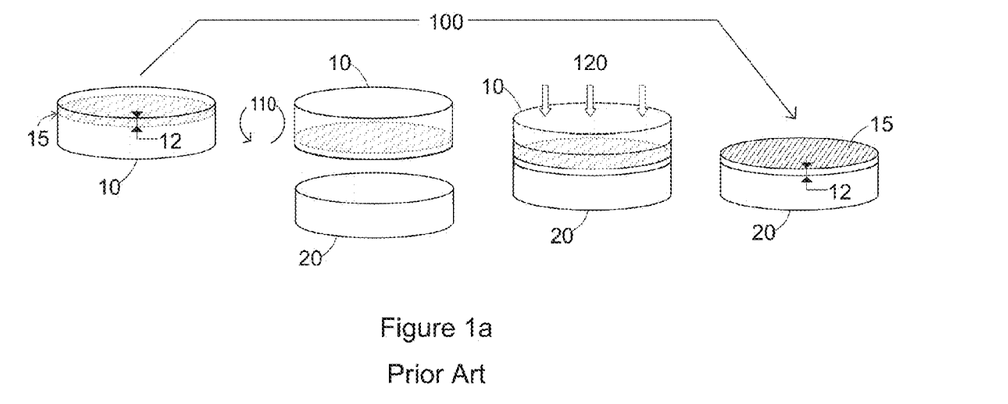
FIGS. 1a and 1b illustrate the problem addressed by the invention which relates to the flat deformation resulting from the transfer of a functional layer, formed on a first substrate, onto a second substrate.
Figure 1B:
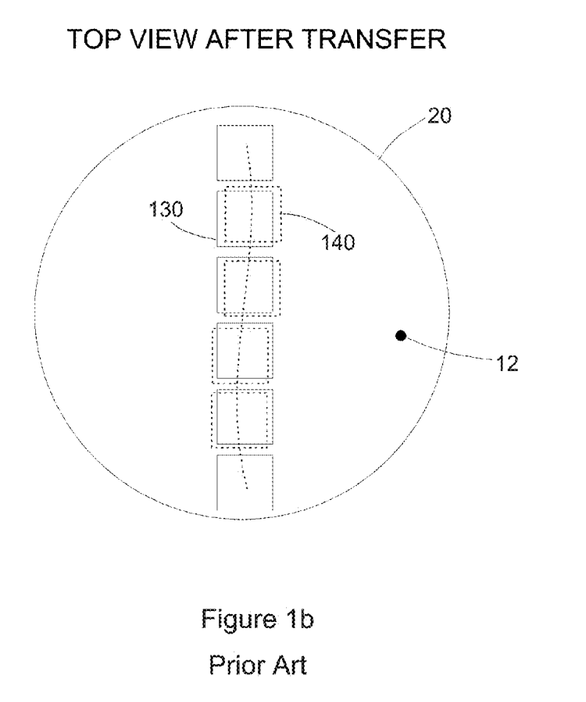

Whatever the type of device considered, if the production thereof requires using the transfer of a functional layer from a first substrate onto a second substrate, the transfer always involves a geometric deformation of the thin transferred layer, called a flat deformation. This problem is illustrated in FIGS. 1a and 1b. FIG. 1a shows a first substrate 10, typically a semiconductor substrate, on the surface of which a functional layer 12 has been produced possibly using all the techniques developed by the microelectronics industry for decades. All the integrated circuits production techniques are liable to be used to provide all or part of the electronic function of the device in this layer. In particular, the first substrate 10 may be a developed substrate of the SOI type, for "silicon on insulator", wherein necessary components will be provided in the thin single-crystal silicon surface layer thereof, above a "buried oxide layer" 15 most often referred to by its acronym BOX for "buried oxide layer," which will become the functional layer 12.

The transfer 100 of the layer 12 onto the second substrate 20 is then conventionally carried out by bonding, after turning over 110, with the first substrate on the upper face of the second substrate 20. Various bonding techniques aiming at making the two substrates integral are known which allow to make surfaces made of commonly used semiconductor materials and in particular silicon and the oxide (SiO2) thereof adhere. It may be a direct bonding (i.e. without the addition of an adhesive substance), or a bonding using an adhesive. The functional layer 12 remains on the second substrate after removal or separation of the first substrate 120. Various techniques are known too and applied so as to leave only the functional layer 12 on the second substrate. In particular, in case a first substrate of the SOI type is used, the latter may, after bonding, be mechanically and chemically attacked 120 until the buried oxide layer 15 is reached. Then only the thin single-crystal silicon layer of the start SOI substrate from which the components of the functional layer 1 will have been made, remains on the second substrate 20, optionally protected by the buried oxide layer 15 thereof (all or part of this layer may also be removed).

However, whatever the technique used for the transfer, a flat deformation occurs. The result is shown schematically in FIG. 1b. The patterns 140 defining the components provided on the total surface of a wafer then no longer occupy the initial nominal position 130 that had been precisely defined during the steps of manufacturing of the functional layer 12 on the first substrate, usually by photolithography. This significantly affects the positioning of the portion of the devices remaining to be manufactured after the transfer.

For example, for small-sized imaging devices, the uncertain positioning of components, such as pixel electrodes, penalizes the optical quality of the manufactured device. In particular, the pixel aperture ratio (OAR for Open Aperture Ratio) is greatly reduced.

Thus it is necessary to at least limit the disadvantages due to flat deformations during transfers.

SUMMARY OF THE INVENTION

According to one aspect, the invention relates to a method for manufacturing an opto-microelectronic device from a first substrate comprising the production of at least one electronic component and more particularly a pixel electrode in the semi-conductor substrate after transfer of the first substrate onto a second substrate, characterized in that it comprises:
  a first phase carried out before the transfer and comprising forming at least one pattern made of a sacrificial material in a layer of the first substrate,
  a second phase carried out after the transfer and comprising the substitution of the electronic component for the pattern.

Such method ensures the self-alignment of the pixel electrodes and no method such as photolithography is required for the production thereof, after the transfer, and the positioning accuracy is thus increased.

Whereas the persons skilled in the art have so far tried to develop means to reduce the flat deformation itself, the invention describes a manufacturing method making it possible to accommodate this deformation without compromising the device production accuracy, either before or after the transfer. The method of the invention particularly applies to, but is not limited to the case of optoelectronic devices such as imaging devices mentioned above which must be produced on a transparent substrate.

According to another aspect, the invention features a microelectronic device obtained by the method.

Other objects, features and advantages of the present invention will become apparent when reading the following description and referring to the accompanying drawings. It is understood that other advantages may be incorporated therein.

BRIEF DESCRIPTION OF THE FIGURES

The objects, aims as well as the characteristics and advantages of the invention will become more apparent from a detailed embodiment thereof which is illustrated by the following accompanying drawings, wherein:

FIGS. 2a to 2h illustrate a first implementation of the method according to the invention which eliminates the flat deformation while taking as an example the production of an optoelectronic device of the imaging device type.

FIG. 6a is a partial top view of FIG. 2a. FIG. 6b shows a partial top view of the configuration of FIG. 2c. FIG. 6c diagrammatically shows a step of transferring a portion of a substrate.

The accompanying drawings are given as examples and are not restrictive of the invention.

DETAILED DESCRIPTION OF THE INVENTION

In the present application, the production of at least one electronic component should be understood as a step or a sequence of steps leading to the concrete forming of an electronic component. Thus the electronic component is, according to the invention, actually formed during this step of the production. This does not exclude that preparatory phases may be executed before the production of the electronic component. This component may be any element capable of executing a function in a microelectronic device including those referred to in the "technical field of the invention" section. Advantageously, the electronic component is an electrical conductor. It may form or help forming: an electrode, a transistor, an element of an electrical connection.

It is preferably a pixel electrode, in particular for an imaging device of less than 2.54 cm screen diagonal.

It may also form or help forming an optically useful member such as a screen barrier against rays from a light source.

In the preferred embodiment discussed below, the electronic component is a pixel electrode.

Generally, according to the invention, a plurality of identical or similar components will be manufactured simultaneously, but this case is not limiting.

Before starting the description while referring to the drawings, optional advantageous features of the invention are introduced below. These may be used alternatively or cumulatively:

the first phase includes the lateral delimitation of the pattern in the layer of the first substrate by an edge of a boundary material differing from the sacrificial material.

the pattern is a box fully enclosed laterally by the edge.

the edge is obtained by depositing around the pattern the boundary material and by forming a boundary material layer above the layer comprising the pattern.

it comprises after deposition around the pattern, the thinning of the layer of boundary material until a thickness of less than the minimum lateral dimension and the edge thickness is obtained.

the first phase comprises forming a light screen overlaying the pattern.

the screen is formed by photolithography in a layer of the first substrate superimposed on the layer including the pattern.

the substitution of the electronic component for the pattern comprises removing the sacrificial material of the pattern.

the sacrificial material pattern is removed by selective etching in order to attack the sacrificial material and to preserve the boundary material.

the second phase comprises, after removing the sacrificial material of the pattern, removing the boundary material layer.

the boundary material layer is removed by etching controlled in time so as to remove the boundary material layer and to preserve the edge.

the substitution of the electronic component for the pattern comprises, after removal of the sacrificial material of the pattern, a deposition of the electronic component material.

it comprises a thinning of the thickness of the deposition of the electronic component material until the level of the edge thickness is reached.

it comprises, before the transfer, forming the layer including the pattern on an underlying layer of the first substrate, followed by forming at least one layer including at least one additional electronic component then forming a connecting layer.

the first substrate is transferred onto the second substrate by the connecting layer of the first substrate and the thickness of the first substrate is reduced by the underlying layer until the layer including the pattern is reached.

it comprises, before the transfer, forming at least one layer including at least one additional electronic component on an underlying layer of the first substrate, followed by forming the layer including the pattern and then forming a connecting layer.

the transfer comprises:
  A transfer of the first substrate by an outer face of the connecting layer onto an intermediate substrate,
  A reduction in the thickness of the first substrate by the underlying layer until an inner face is reached,
  A transfer of the first substrate by the inner face onto the second substrate,
  Removing the intermediate substrate and reducing the thickness of the first substrate by the connecting layer until the layer including the pattern is reached.

forming at least one pattern comprises a phase of photolithography.

the sacrificial material is silicon oxide.

the electronic component is an electrical conductor.

the electronic component is a pixel electrode.

silicon nitride is selected as a boundary material.

the edge is of a boundary material different from the boundary material of the layer.

the manufacture of an imaging device with a diagonal of less than 2.54 cm with transmission lighting.

In the following examples, reference is made to choices of materials whose selection is advantageous for the invention. However, these selections are not limiting the embodiments of the invention.

FIGS. 2a to 2h show a first implementation of the method according to the invention which eliminates the flat deformation after the transfer.

Although the invention is described below on the basis of the production of an optoelectronic device of the imaging device type on a transparent substrate the invention is in no way limited to this particular example. Persons skilled in the art will readily adapt the method to other substrates and other applications and devices that are not necessarily optoelectronic ones.

In the example chosen to illustrate the invention the issue is, as already mentioned briefly in the state of the art chapter, to produce the pixel matrix of an imaging device of the micro-projector type. This type of projector, often of a small size well below one inch (25.4 mm), is so designed as to project images directly from the portable device wherein it is integrated. Pixels are then necessarily small too, typically of a few microns (one micron or micrometer=$10^{-6}$ meters) square. The matrix may include hundreds of thousands or even millions of these pixels, depending on the applications. Each pixel is associated with at least one selection transistor which must advantageously occupy as small as possible a surface in order to keep the remaining surface of each pixel transparent and thereby to obtain as high an aperture ratio as possible. The open aperture ratio or OAR is the ratio between the transparent and the opaque surface areas of each pixel. The optical part is usually made of a layer of liquid crystals most often referred to by their English acronym LCs for "liquid crystals". Whereas traditional large-sized liquid crystals displays and imaging devices (tens of inches) simply use thin film transistors or TFT obtained from a low-temperature deposition of amorphous or polycrystalline silicon, and which are not very efficient, the selection transistors and all the electronic peripheral devices are advantageously produced from a single-crystal silicon layer which makes it possible to obtain very small however very efficient transistors. Then it must be possible to produce these on a first semiconductor substrate before transferring these onto a second transparent substrate. This transfer causes the flat deformation, with the drawbacks described above.

The method described herein provides a solution to the positioning of the pixels, after the transfer, as compared to the selection transistors, by defining the geometry of the pixels as from the very first steps of the method, even before forming the selection transistors in the transferred layer.

Figures 2A, 2B, 2C, 2D, 6A, 6B, 6C:
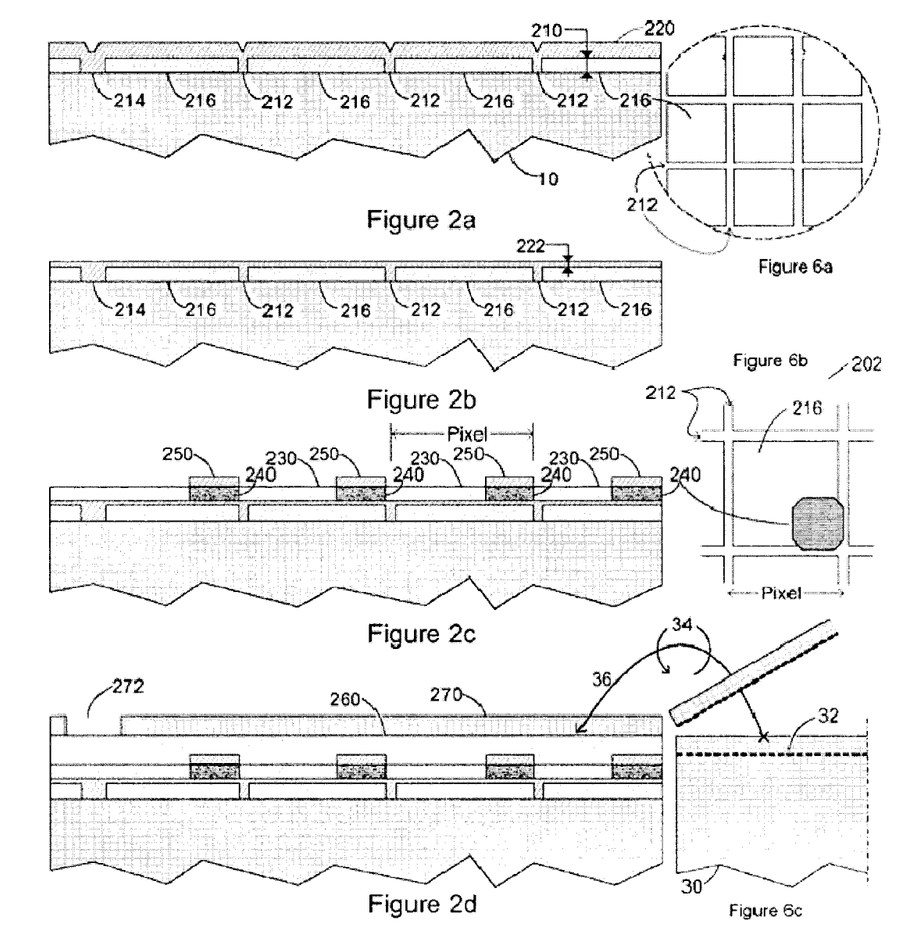

As shown in FIG. 2a the manufacturing method of the invention consists in starting from a first advantageously standard semi conductor substrate 10 to form a first portion of the device. Typically, the latter consists in a wafer totally composed of single-crystal silicon thick enough to be handled without difficulty. The diameter of the currently largest wafers may be for example up to 30 cm and the thickness thereof of several hundred microns so that they can have a sufficient mechanical stiffness.

A silicon oxide layer 210 (SiO2) is then thermally grown on the substrate, wherein the pixel patterns that will be produced after the transfer will be defined by photolithography. According to the invention, such patterns are advantageously formed to determine the location of the electronic component (such as an electrode) to be subsequently produced. These patterns may be boxes 216, having, for example a rectangular or a square section, formed in the thickness of a layer of the first substrate 10. It is not excluded that the layer may be composed of a plurality of sub-layers. The SiO2 layer 210 shown typically has a thickness of 250 nm. As shown in the top view (FIG. 6a), for example, the patterns are typically squares with a side dimension of a few microns separated by apertures 212 provided in the oxide. The apertures typically have a width 212 of 0.5 micron. The presence of an aperture 214 can also be noted, which lets the position marks (not shown) visible, as etched in silicon, and which are useful for positioning the subsequent lithography operations. FIG. 2a shows a section of the device being developed after a layer 220 of the boundary material of the pixel electrode pattern has also been deposited over the entire surface. The material is for example silicon nitride or polycrystalline silicon.

According to a possible embodiment, the lateral boundary (i.e. in the plane of the substrate) may be made with a first material (such as silicon nitride or polycrystalline silicon) and the boundary at the bottom of the box may be made of a second material (such as, respectively, polycrystalline silicon or silicon nitride). Thus the difference in material may be used during the subsequent selective chemical etching.

This material is deposited in sufficient thickness to fill all apertures 212 which will then form a boundary edge of the pixels geometrically defined at this early stage by the patterns each forming a box 216 filled with silicon oxide corresponding to the layer 210. This oxide layer is a sacrificial layer. Upon completion of the method, as will be seen below, the oxide boxes 216 are etched by chemical etching (e.g. using a "Reactive Ion Etching" which is confined by the nitride layer 220 which advantageously surrounds these completely.

FIG. 2b shows a section of the device being produced after the silicon nitride layer 220 has been levelled by a chemical mechanical polishing designated by the English acronym CMP. Only a thin thickness 222, of typically 50 nanometers (1 nanometer or nm=$10^{-9}$ meter), is left of the layer 220 above the boxes 216. The thickness is preferably smaller than the width of the side edges. Optionally it is possible to leave only the areas between the boxes 216 of the layer 220, and to deposit, on the whole assembly a continuous layer 222 of another material which will be used to define what will subsequently become the "bottom" of the boxes.

FIG. 2c shows the result of several of the following steps of the method. After forming the completely delimited oxide boxes, on the one hand by the edges 212 and on the other hand by the thin layer 222 of silicon nitride, the metal connections 240 of each of the pixels are then formed. These connections will make it possible, upon completion of the method, to electrically connect the transparent conductive electrode which will be substituted, in each box 216, for the silicon oxide which is currently present. The material of the metal connections 240 is preferably tungsten (W), which has good electrical conductivity while being resistant to the thermal treatments which will follow. In each pixel, the metal connection 240 may also play another important role. It will be used as an optical screen for the selection transistors that will be produced in the following steps of the method. As a matter of fact, the light source that illuminates the pixel matrix must not affect the electrical behaviour thereof. An opaque screen must therefore advantageously cover the entire surface as shown schematically in the top view of a pixel 202 in FIG. 6b. The interest of making small-sized however efficient transistors in order to affect as little as possible the aperture rate (OAR) of the pixel, is obvious.

The metal connections and screens 240 made of tungsten are formed by the prior deposition of an oxide layer 230 whose thickness is typically 350 nm. Conventionally, the patterns 240 are etched in this layer. A uniform deposition of tungsten with a thickness sufficient to fill the etched patterns is then executed. This deposition is followed by chemical mechanical polishing (CMP) whose aim is to eliminate tungsten above the not etched parts of the oxide layer and to level the surface to obtain tungsten islands 240, forming screens and connections to the pixels, embedded in oxide 230 used as insulation.

After levelling, a layer 250, preferably of silicon nitride or polycrystalline silicon, is advantageously deposited and then etched in a conventional manner by photolithography in order to open the pixels therein outside the tungsten screens. The thickness of this layer is typically 50 nm. This layer will facilitate the opening of the contact pads with the tungsten islands 240, as described later.

FIG. 2d shows the result of the following steps of the method wherein a thin single-crystal silicon layer 270 will be obtained on an oxide layer 260 to make another part of the device. The single-crystal layer 270 will make it possible to produce preferentially all the selection transistors of the pixels and possibly all the electronics peripheral devices with excellent performances.

The layer 260, having a typical thickness of 400 nm, is obtained in a conventional manner by depositing oxide over the entire surface of a wafer. The oxide used in these operations is typically silicon oxide (SiO2). The layer 260 is levelled again using a chemical mechanical polishing (CMP).

To obtain the single-crystal silicon layer 270, it must be transferred from an auxiliary donor substrate 30. All the techniques used by the microelectronics industry to manufacture the SOI substrates mentioned above may be used to obtain this result. Conventionally a fracture plane 32 shown in FIG. 6c, may have been created, for example, by implantation of hydrogen into the donor substrate 30. After turning over 34 and gluing of the donor substrate on the oxide layer 260, a heat treatment is advantageously executed, and this enables to strengthen the bonding energy in case of direct bonding, and optionally to rearrange the structure of the single-crystal silicon which may have been disturbed by the ion implantation. It is mainly used to weaken the fracture plane 32 thus enabling a separation of the donor substrate 30 by cleavage, only because of the heat treatment or by applying additional mechanical forces. A layer 270 which is polished (CMP) to obtain a satisfactory surface condition and which is integral with the oxide layer 260 is then obtained. The donor substrate is reusable. A layer 270 whose thickness is typically between 100 and 300 nm, for example 180 nm is left. It should be noted, at this stage of the illustrated embodiment, that the layer transfer 36 does not raise the problem of flat deformation addressed by the invention since no pattern had been previously defined in the transferred layer 270.

The layer 270 transfer is followed by an opening in the silicon layer 272 areas so that the positioning marks mentioned above remain visible.

Moreover, some or all of the active components of the device, mainly transistors are produced at this stage in and from the single-crystal silicon layer 270. They are still generally referred to as additional electronic components. For clarity, these are not shown in FIG. 2d and following, but are an integral part of the layer 270. The manufacturing operations performed at this stage are called FEOL, for "front end of line", i.e. "production line start": they may require high temperatures which must however remain compatible with tungsten 240 which was used for the connection to each pixel and to create the screen of the selection transistors. Typically, the sources and drains of MOSFET type transistors, the most used by the microelectronics industry will be found in this layer 270. Called "metal oxide semi-conductor field effect transistor", these transistors include a control grid usually made of polycrystalline silicon. The assembly is embedded in oxide. The layer 270 is thus an overall single-crystal silicon-based layer. Its structure will generally not be different from what is common practice for the manufacture of integrated circuits. For example, a widely used technology is the so-called CMOS technology, implementing complementary transistors (C) of the p-channel and n-channel metal-oxide-semiconductor (MOS), types. These are made in a standard way from a single-crystal silicon layer similar to the layer 270 and may therefore be made therein if necessary. For a more detailed view of the layer 270, refer to FIG. 3a which illustrates a second embodiment of the method of the invention.

Figure 2E:
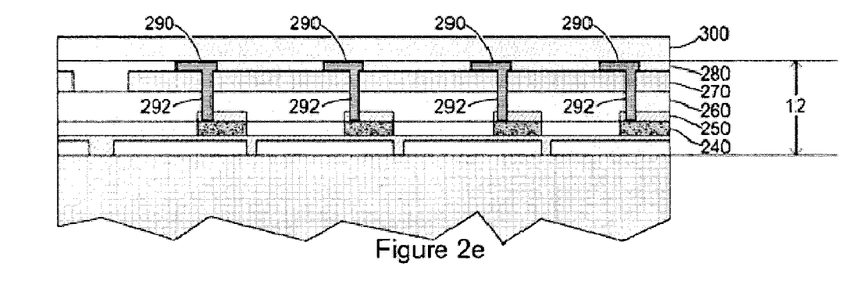

FIG. 2e relates to the so-called BEOL subsequent steps, for "back end of line", i.e. "end of manufacturing line" where the metal interconnections between active components which have been newly manufactured in, and from the layer 270, are to be produced, as explained above. The metal interconnections must generally be formed at much lower temperatures than the «line start" temperatures. Currently, the metal used is most often copper. The implementation of copper may require using a layer of tantalum (Ta) and tantalum nitride (TaN) to prevent the diffusion thereof to other materials and especially to silicon. This technology has become a standard in the microelectronics industry. For clarity these layers are not represented here.

The copper interconnections are advantageously produced by embedding or damascene copper patterns 290 into an oxide layer 280, previously deposited on the layer 270 of the active components, and wherein the patterns 290 have been etched. The operations are mainly the same as those described to obtain the tungsten screen 240 inlaid in the oxide layer 230.

At this point, however, the vertical connections, i.e. the vias, must also be produced, which allow to reach the active components electrodes. For clarity, only one level of interconnection is shown in FIG. 2 and the following. It consists of the oxide layer 280 wherein the copper patterns 290, which are used to interconnect the components, are embedded. In practice, however, more than one level of interconnection is usually provided. Depending on the wiring density to be provided, 4 to 8 levels, separated by oxide layers, are commonly required. For example, refer to FIG. 3a which illustrates a second embodiment of the invention, where four levels of horizontal and vertical interconnections are represented. The level shown in FIG. 2e and the following, located closest to the active components contained in the layer 270, is the first level of interconnection composed of the copper patterns 290 embedded in the oxide layer 280. Vias, not shown, enable the vertical connections between the levels. The only vias that are shown are those that specifically relate to the invention. These vias 292 make it possible to interconnect the first wiring layer and the tungsten screens 240 to be used, as discussed in the final stages of the method, to electrically connect the pixel electrodes with the selection transistors that have been provided in the single-crystal silicon layer 270. For this purpose, the vias 292 are etched through the single-crystal silicon layer 270, preferably at the oxide zones that the layer contains (so-called STI areas, whose definition may be found in FIG. 3a) to avoid having to isolate these, then through the oxide layer 260 and the silicon nitride patterns 250 covering the screens to reach the tungsten screens 240 themselves. This etching is a so-called "deep" etching because the thickness of the material to be etched is important as compared to the tungsten thickness whereon we must stop. This is the reason why silicon nitride pads are provided on the tungsten pads. The vias apertures are produced using the silicon nitride pads as stops for the etching. Then the etching of the residual silicon nitride pads is continued by selective etching of the tungsten until the latter is reached.

After etching the vias and wiring pattern in the oxide layer 280, copper is deposited over the entire surface of the wafer for filling these. As previously explained with the forming of the tungsten screens, excess copper above the not etched parts is removed and the surface levelled during a subsequent operation of chemical-mechanical polishing (CMP) that leaves only the copper patterns insulated 290 in the oxide layer 280.

As mentioned above, usually more than one wiring layer is provided. The above operations are repeated as many times as there are wiring layers. The layers are insulated from each other by an intermediate oxide layer. Interconnection is provided by interlayer vias. Vias are also used to connect the transistors electrodes. Forming the wiring layers and vias mentioned above is the essential part of the standard end of line or BEOL operations as already discussed.

When all the metal interconnections necessary have been formed a new uniform layer 300 of silicon oxide is deposited. It typically has a thickness between 2000 and 3000 nm. This layer is a connecting layer which will be used as a bonding surface on the second substrate for transferring the functional layer 12 as explained in the following steps.

Figure 2F:
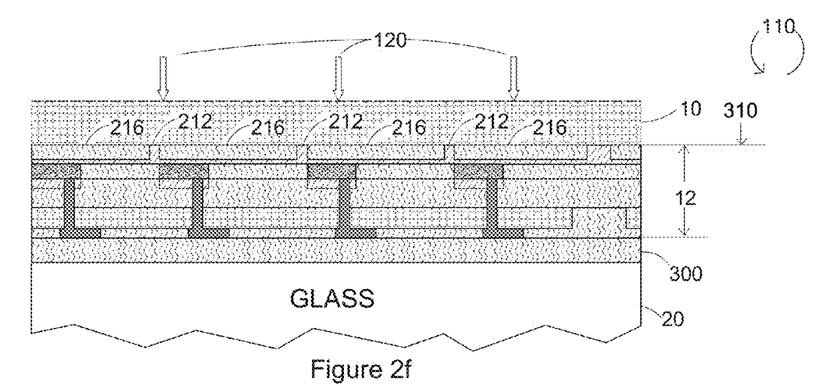

FIG. 2f is a view of the device being manufactured after turning over 110 and transfer onto a second substrate 20 to form a second part of the device. In the case of an optoelectronic device, as in the example of the imaging device used to describe the invention, the second substrate is preferably transparent. It typically will be a glass substrate 20 whose upper surface is bonded to the oxide layer 300 as just described in the previous figure.

The first substrate 10 must then be removed to reach the surface 310 of the boxes 216 and the edges 212 that were formed during the first steps of the method as described in FIG. 1a. The first substrate 120 will, for example, be removed by thinning with chemical and/or mechanical attacks. A final polishing makes it possible to obtain a satisfactory surface condition. Polishing is stopped upon of the detection of the silicon nitride edges 212 which are made of a particularly hard ceramic.

Figure 2G:
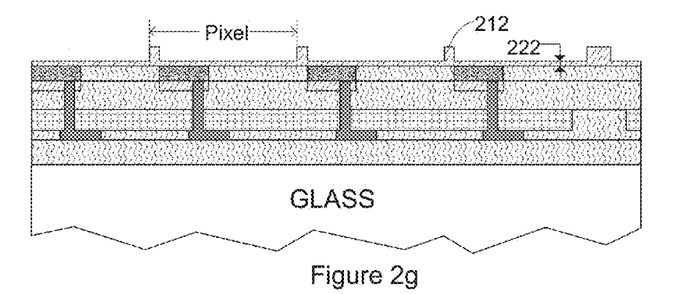

FIG. 2g shows the result of the next step of removing the sacrificial material, with the silicon oxide forming the boxes 216. It should be noted that this operation, and the following described in FIG. 2h below, do not require any photoetching. They easily accommodate the flat deformation which possibly occurred during the transfer of the functional layer 12 as described in the previous figure. With the silicon oxide filling the boxes 216, the sacrificial material is removed by means of selective etching, on the entire surface of a wafer, for example by RIE etching, leaving the edges 212 and the thin layer 222 of silicon nitride present on the bottoms of the wells.

Figure 2H:
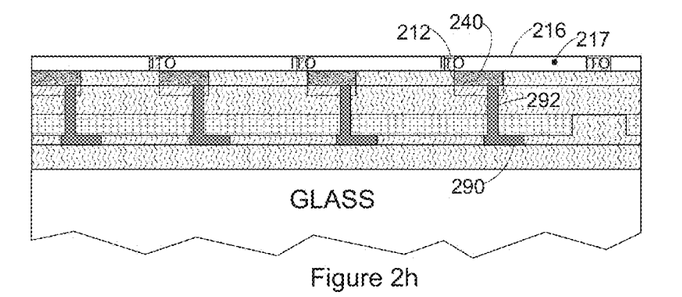

As shown in FIG. 2h, the thin layer of silicon nitride 222 present at the bottom of the wells must then be removed so as to provide an electrical contact between the screen 240 and the material 217 which will ultimately fill the boxes 216. This material is typically ITO, for "Indium tin oxide," which means a "tin and indium oxide", a transparent conductive material very often used as an electrode in optoelectronic devices The layer 222 is preferably removed by means of a preferably anisotropic attack limited in time, of silicon nitride (or another material optionally) so as to leave the main part of the edges 212 that self-define the pixels. If, as an optional embodiment previously mentioned, the bottom of the boxes 222 has been delimited by a material other than silicon nitride, selective etching of the silicon nitride, given here as an example for the lateral boundary, of tungsten and the underlying oxide, is executed. The ITO is then deposited over the entire wafer surface and then levelled by a chemical mechanical polishing (CMP) which leaves, as shown, the boxes 216 filled with ITO 217 used as the conductive electrode of the pixels. The optical components (not shown) are formed above the ITO electrodes, more particularly by inserting a liquid crystal layer whose polarization is controlled in front of each pixel by the ITO electrode. It is itself controlled by the selection transistors and the peripheral electronic devices (not shown) contained in the layer 270 through the vias 292 and the metal connections 290 previously discussed.

The method described in FIGS. 2a to 2h is thus completely free of flat deformations by not using photolithography or positioning operations to produce the pixels after the transfer of the functional electronic layer. The pixels are self-aligned on the electronic part transferred. The screen 240 completely covers the selection transistor and the positioning thereof is not affected by the flat deformation.

Figure 3A:
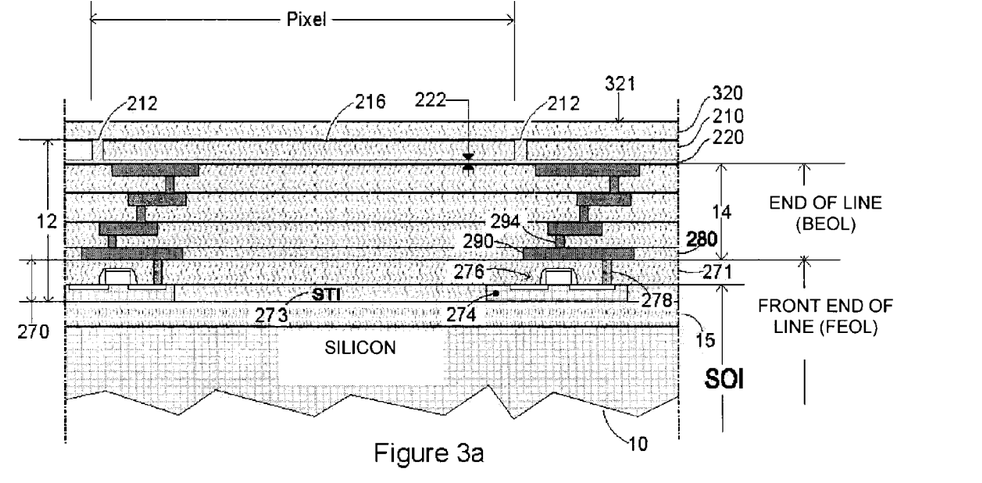
FIGS. 3a to 3c illustrate a second implementation of the method according to the invention wherein a transfer of the functional layer is first carried out onto an auxiliary substrate.
Figure 3B:
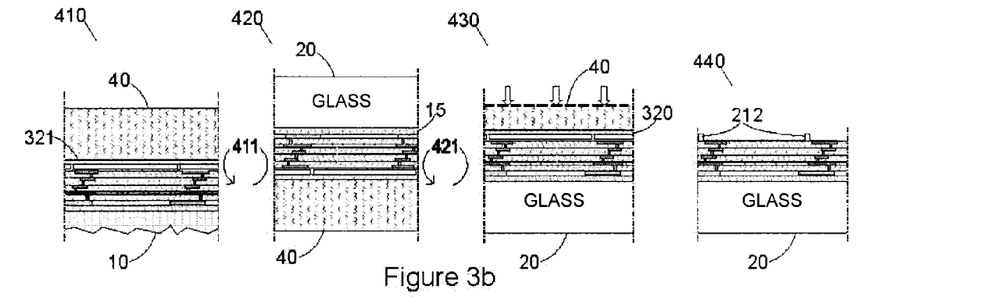
Figure 3C:
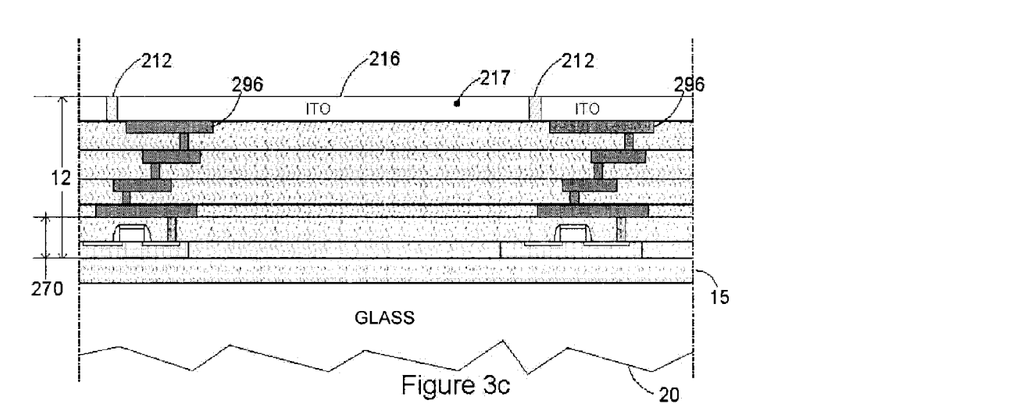

FIGS. 3a to 3c illustrate a second embodiment of the method according to the invention wherein the functional layer is first transferred onto an auxiliary substrate.

FIG. 3a is a sectional view of the optoelectronic device used to describe the method of the invention after all the steps of manufacturing to be executed before the transfer of the functional layer 12 are completed.

In this second implementation of the invention, the whole electronic part of the device is typically produced form a first substrate 10 preferably of SOI type. All the active components may then be produced as for any standard integrated circuit. In single-crystal silicon islands 274 electrically isolated from each other by oxide 273 formed according to a so-called STI technology, for "shallow trench isolation", transistors 276 of the MOSFET type are produced. The grids of the polycrystalline silicon transistors and the vias 278 giving access to the electrodes of the transistor from the first level of interconnections are embedded in a levelled layer of oxide 271. As seen above, the operations for the production of these transistors are called front end of line operations (FEOL).

The manufacturing operations that follow, called end of line (BEOL) operations, intended to execute all the interconnections between the components require several wiring levels which are each made, as already explained, by embedding copper into an oxide layer. For example, four wiring levels are shown which include, and are similar in structure to the first level consisting of copper patterns 290 embedded in the oxide layer 280. Together they constitute the overall wiring layer 14 for interconnecting all the device components. The connections between the levels are preferably provided with vertical vias such as 294.

Up to this stage the manufacturing operations carried out before the transfer may be identical with those required for the production of a conventional electronic integrated circuit. The following operations are specific to the invention. They consist in forming the oxide boxes 216 of the sacrificial layer 210, already described in FIG. 2a. However, the method for obtaining these boxes completely encapsulated in a layer 220, for example, of silicon nitride is different. A thin layer 222 of silicon nitride having a typical thickness of 40 nm, this time is first deposited over the entire surface of the wafer to insulate the bottoms of the wells 216. The silicon oxide layer 210 wherein the apertures corresponding to the white line of pixels edges 212 are etched by photolithography, is then deposited. The apertures are then filled by a second deposition of boundary material such as silicon nitride. The excess nitride on the not etched oxide portions, except for the apertures, is removed and the surface levelled by chemical mechanical polishing (CMP). These operations are followed by the deposition of an additional silicon oxide layer 320 and a new chemical-mechanical polishing of the surface 321 in order to obtain a surface condition allowing bonding with a view to an initial transfer onto a temporary support that will play the role of "operating handle" for the functional layer.

FIG. 3b diagrammatically shows the two transfer operations of the functional layer that will allow it to be eventually associated to a transparent substrate such as a glass substrate.

As shown in 410, the operating handle, i.e. an intermediate substrate 40 preferably of silicon is glued, preferably by removable gluing, for example having a low bonding energy, on the upper surface 321 of the connecting layer 320 of the structure corresponding to FIG. 3a containing the functional layer already manufactured.

After the turning over 411 and the removal of the initial silicon substrate 10 of the SOI type until the buried layer 15 is reached the bonding of the glass substrate 20 on the buried layer 15, now apparent, the initial SOI substrate 10 may be executed, as shown in FIG portion 420. The removal of the silicon from the SOI substrate illustrated in 430 may be executed by combining mechanical and chemical attacks until the buried oxide layer is detected. The chemical attack uses, for example, a silicon etching product known as TMAH or "tetramethyl ammonium hydroxide". CMP polishing is performed on the buried layer 15 to obtain a surface condition that will allow bonding of the glass substrate 20.

After a new turning over 421, the auxiliary silicon substrate 40, the operating handle is removed to reach the oxide layer 320 protecting the functional layer 12. This removal may be executed under the same conditions as below. In this case, the handle substrate is destroyed. Optionally, if a removable bonding has been used, it is possible to remove the handle at the bonding interface, for example by the application of mechanical forces. In this case, the handle is preserved and may be reused after a possible reconditioning for a new transfer.

As shown in 440, the oxide layer 320 is in turn removed and the sacrificial oxide 216 of the boxes is etched, under the same conditions as previously described in FIG. 2a, which leaves only the edges 212 and the silicon nitride layer 222 at the bottom of the boxes.

The end result is shown in FIG. 3c. As described above in FIG. 2h, silicon nitride is etched, leaving only the edges which typically have a final width of 0.5 micron. The boxes are filled with ITO 217 as also described in FIG. 2h defining the pixels of the device without photolithography.

In this second implementation of the method of the invention, it should be noted that the ITO electrodes are then in direct electrical contact with the copper patterns 296 of the upper wiring layer and it has not been necessary to form tungsten contact patterns 240 and vias and 292 to have access thereto.

Advantageously, one or the other patterns of the overall copper wiring layer 14 are substituted for the tungsten patterns 240, which are also used as the optical screen of the selection transistors 276. The copper patterns of the global layer 14 may also advantageously be geometrically combined together to form the optical screen protecting the selection transistors 276.

Figure 4:
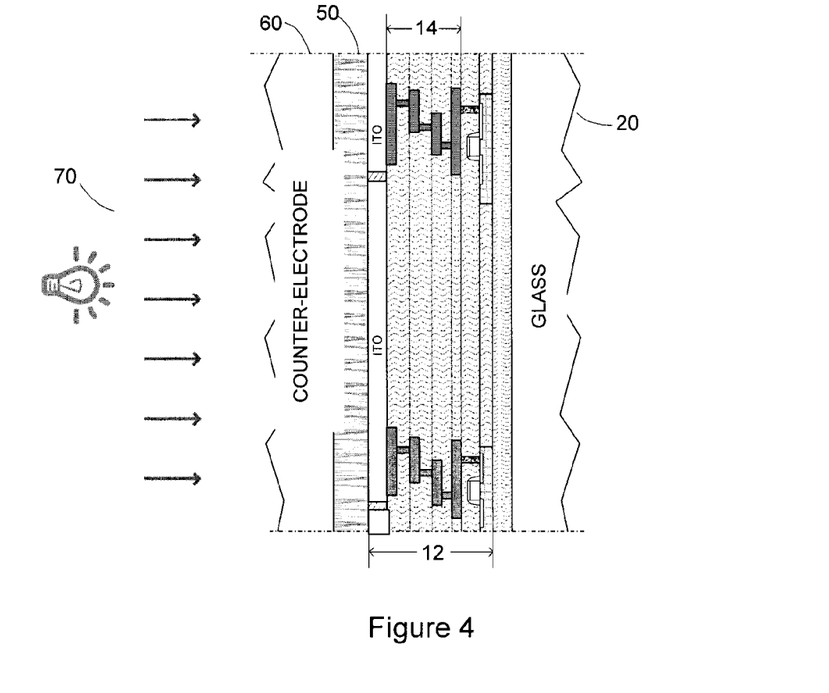
FIG. 4 shows the advantage of being able to light the optoelectronic device used to describe the invention from the counter-electrode on the liquid crystal layer side.

FIG. 4 shows the main optical parts of an optoelectronic device according to the invention produced at the end of the steps of the method described above. In this type of device, a liquid crystal layer 50 is formed which is inserted between a transparent counter-electrode 60 and the ITO electrodes 217 of the functional layer 12 manufactured according to the method described in FIGS. 2a to 2h or that of FIGS. 3a to 3c. Coloured filters (not shown) may also be provided on the counter-electrodes.

Advantageously, an imaging device manufactured according to the method of the invention may be lit from the side of the counter-electrode 60, perpendicularly thereto. The light rays 70, which may be generated by a coherent source such as a laser, then form a perfectly collimated beam which passes through the counter-electrode and the liquid crystal layer with a normal incidence. In the absence of coloured filters (for example, in the case of a monochrome screen, or in the case of a colour screen of which each colour is processed sequentially), as the counter-electrode and the liquid crystal layer contain no pattern, no ray diffraction occurs. The normal incidence of the lighting of the layer 50 is used to optimize the performances of the liquid crystals contained in this layer. Extremely short response times, high contrast with very low control voltages may then be obtained. To maintain these results, especially not to see the contrast decrease significantly, the light rays must not be deflected from their paths. This would be the case if the lighting of the imaging device was generated from the other side, i.e. through the transparent glass substrate 20. The light rays would then be liable to be diffracted, especially by the various metal patterns of the overall wiring layer 14, even before going through the liquid crystal layer 50, thus losing the advantage that would result from using a coherent light source and degrading significantly the performances of the optoelectronic device.

Figure 5:
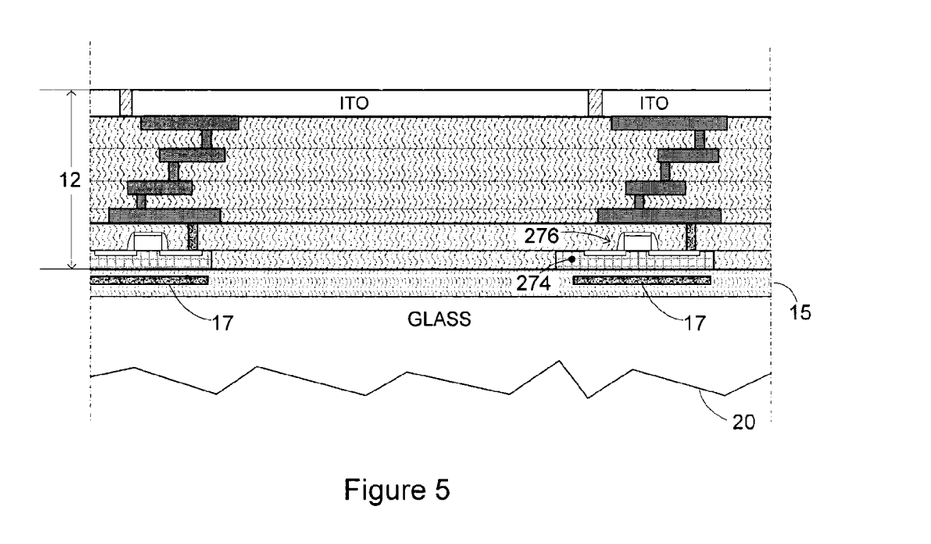
FIG. 5 shows an optional step of the second implementation of the method according to the invention making it possible to create a screen optically protecting the selection transistors from light which may come from the second substrate.

FIG. 5 illustrates an optional step preliminary to the second implementation of the method according to the invention described in FIGS. 3a-3c. We have seen that in this case the screens which protect the selection transistors of the incident light source used to light the pixels are constituted by metal patterns of the overall wiring layer 14.

However, in this structure a little light may be reflected by the glass substrate 20, or come from the ambient light passing through the transparent substrate. Although the selection transistors 276 are partially protected on that side by the silicon 274 wherein they are formed, but in order for the operation of the selection transistors and the peripheral electronic devices not to be affected, the invention provides that a preliminary step may be executed wherein a screen 17 advantageously made of tungsten may be created under each of the selection transistors. To obtain this result, the steps of the method for forming the tungsten screen described in FIG. 2b may then be applied. The result is as shown in FIG. 5. The tungsten screen is embedded in the oxide layer 15 which corresponds to the so-called BOX or "buried oxide" layer of a standard SOI substrate. To implement the additional step described in FIG. 5, this layer 15 will have to be produced in several steps as described in FIG. 2b, and in this case it will not be possible to start from a standard SOI substrate. It should be noted that the screen 17 only plays the role of the optical screen and needs not be electrically connected to something else. Therefore no via is needed to connect it in this case.

It should finally be noted that whatever the embodiments described in the preceding figures, the alignment of the screen (s) protecting the selection transistors is still nominal and does not depend on the flat deformation since all the photolithography operations are executed prior to the transfer. The pixel aperture ratio (OAR) remains optimal, it is typically greater than 70%. The pixels defined by their electrically conductive electrode in a transparent material, ITO, are self-aligned whatever the amount of the flat deformation detected, which may allow to relax the constraints and specifications of the step of bonding on the glass substrate during the transfer of the functional layer. Finally, as seen in FIG. 4 lighting may be from the counter-electrode side, which avoids diffraction before going through the liquid crystal layer.

The invention claimed is:

1. A method for manufacturing an opto-microelectronic device from a first semiconductor substrate, comprising the production of at least one electrode of a pixel after a transfer of the first semiconductor substrate onto a second substrate, the method comprising:
   a first phase carried out before the transfer and comprising:
   i) forming at least one pattern made of a sacrificial material in a layer formed in the first substrate surface,
   ii) a lateral delimitation of the at least one pattern in the layer of the first substrate surface by an edge of a boundary material differing from the sacrificial material,
   a second phase carried out after the transfer and comprising a substitution of the electrode for the pattern including a removal of the sacrificial material of the pattern by a selective etching so configured as to attack the sacrificial material of the pattern and to preserve the boundary material without using photolithography.

2. The method according to claim 1, wherein silicon nitride or polycrystalline silicon is selected as the boundary material.

3. The method according to claim 1, wherein the pattern is a box entirely surrounded laterally by the edge.

4. The method according to claim 3, wherein the edge is obtained by deposition around the pattern of the boundary material and wherein a layer of the boundary material is formed above the layer comprising the pattern.

5. The method according to claim 4, wherein the edge is of a boundary material different from the boundary material of the layer of the boundary material.

6. The method according to claim 5, wherein the second phase comprises, after removal of the sacrificial material of the pattern, removing the layer of boundary material.

7. The method according to claim 6, wherein the removal of the layer of the boundary material is carried out by etching controlled in time so as to remove the layer of the boundary material and to preserve the edge.

8. The method according to claim 4, comprising, after the deposition around the pattern, the thinning of the layer of the boundary material until a thickness lower than the minimum lateral dimension and the thickness of the edge is obtained.

9. The method according to claim 4, wherein the first phase comprises forming a light screen superimposed on the pattern.

10. The method according to claim 9, wherein the screen is formed by photolithography in a layer formed on the first substrate and is superimposed on the layer including the pattern.

11. The method according to claim 9, wherein the screen is formed in an electrically conductive material.

12. The method according to claim 11, wherein the electrically conductive material is tungsten.

13. The method according to claim 11, comprising:
   a step of forming a pattern covering the screen;
   a step of depositing a layer of silicon oxide;
   a step of levelling the layer of silicon oxide by polishing;
   a step of forming a layer of single-crystal silicon on the layer of silicon oxide by transfer from a donor substrate.

14. The method according to claim 13, wherein the transfer of the donor substrate comprises turning over and bonding the donor substrate on the layer of silicon oxide followed by a heat treatment so configured as to break the donor substrate and leave the layer of single-crystal silicon.

15. The method according to claim 13, comprising the production, in the layer of single-crystal silicon, a selection transistor and the production of a via electrically interconnecting the selection transistor and the screen.

16. The method according to claim 15, wherein the production of the via comprises:
   etching from the layer of single-crystal silicon;
   stopping the etching on the pattern;
   selective etching of the pattern so configured as to remove the pattern material without removing the screen material.

17. The method according to claim 1, wherein the substitution of the electrode for the pattern includes, after removal of the sacrificial material of the pattern, a deposition of the electrode material.

18. The method according to claim 17, comprising a thinning of the thickness of the deposition of the electronic component material to the level of the thickness of the edge.

19. The method according to claim 1, comprising, before the transfer, forming the layer including the pattern on an underlying layer of the first substrate, followed by forming at least one layer including at least one additional electronic component then forming a connecting layer.

20. The method according to claim 19, wherein the transfer of the first substrate onto the second substrate is carried out by the connecting layer of the first substrate and wherein the thickness of the first substrate is reduced by the underlying layer until the layer including the pattern is reached.

21. The method according to claim 1, comprising, before the transfer, forming at least one layer including at least one additional electronic component on an underlying layer of the first substrate, followed by forming the layer including the pattern and then forming a connecting layer, wherein the transfer comprises:
   transfer of the first substrate by an outer face of the connecting layer onto an intermediate substrate,
   reduction in the thickness of the first substrate by the underlying layer until an inner face is reached,
   transfer of the first substrate by the inner face onto the second substrate,
   removal of the intermediate substrate and a reduction in the thickness of the first substrate by the connecting layer until the layer including the pattern is reached.

22. The method according to claim 1, wherein forming at least one pattern comprises a phase of photolithography.

23. The method according to claim 1, wherein the sacrificial material is silicon oxide.

24. The method according to claim 1, for manufacturing an imaging device having a diagonal of less than 2.54 cm with transmission lighting.

* * * * *